United States Patent [19]

Yamamoto et al.

[11] Patent Number: 4,977,568
[45] Date of Patent: Dec. 11, 1990

[54] SEMICONDUCTOR LASER DEVICE

[75] Inventors: Saburo Yamamoto; Masahiro Hosoda, both of Nara; Kazuaki Sasaki, Yao; Masaki Kondo, Tenri, all of Japan

[73] Assignee: Sharp Kabushiki Kaisha, Osaka, Japan

[21] Appl. No.: 286,682

[22] Filed: Dec. 19, 1988

[30] Foreign Application Priority Data

Dec. 18, 1987 [JP] Japan ................................ 62-322600
Dec. 22, 1987 [JP] Japan ................................ 62-326387

[51] Int. Cl.$^5$ .............................................. H01S 3/19
[52] U.S. Cl. ...................................... 372/46; 372/45; 372/48; 372/96
[58] Field of Search .......................... 372/45, 46, 48, 96

[56] References Cited

U.S. PATENT DOCUMENTS 4,868,838  9/1989  Yamamoto ............................. 372/48

FOREIGN PATENT DOCUMENTS 0198656  10/1986  European Pat. Off. .
0209372   1/1987  European Pat. Off. .
5240958   3/1974  Japan .
5241107   2/1975  Japan .
5248066   9/1975  Japan .
 622718   4/1983  Japan .
 627719   4/1983  Japan .
0247985  12/1985  Japan .................................... 372/96

OTHER PUBLICATIONS

Patent Abstracts of Japan (Oct. 22, 1987), vol. 11, No. 325, E-551, 2772.
Patent Abstracts of Japan, (Jul. 4, 1985), vol. 9, No. 159, E-326, 1882.
Patent Abstracts of Japan (Feb. 20, 1987), vol. 11, No. 55, E-481 2502.
Patent Abstracts of Japan, (Aug. 6, 1985), vol. 9, No. 189, E-333, 1912.
Yamamoto et al., (1982), Appl. Phys. Lett. 40(5):372-374.
Yamamoto et al., (1987), J. Appl. Phys. 61(8):3108-3110.
Patent Abstracts of Japan (Aug. 22, 1986), vol. 10, No. 244, E-430, 2300.

Primary Examiner—James W. Davie
Attorney, Agent, or Firm—Irell & Manella

[57] ABSTRACT

There is disclosed a semiconductor laser device with a strip-channeled substrate and a double-heterostructure multi-layered crystal disposed over the substrate, the multi-layered crystal containing an active layer for laser oscillation. This semiconductor laser device comprises an optical waveguide that a semiconductor laser device with a stripe-channeled substrate and a double-heterostructure multi-layered crystal disposed over the substrate, the multi-layered crystal containing an active layer for laser oscillation, which semiconductor laser device comprises: an optical waveguide that is formed within the active layer just above the striped channel of the substrate based on a decrease in the effective refractive index due to the striped channel, the outside of which absorbs a laser beam produced in the active layer; a striped mesa that is formed by the removal of the portions of the multi-layered crystal corresponding to the outside of the optical waveguide; and a plurality of burying layers that are grown into the removed portions to prevent the diffusion of carrier in the transverse direction within the active layer.

5 Claims, 5 Drawing Sheets

FIG.5A
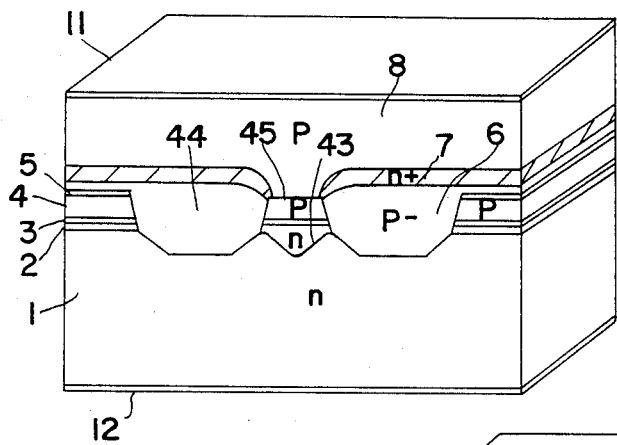
FIG.5B
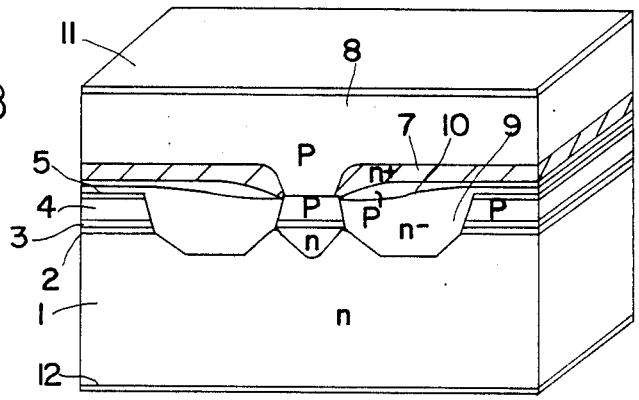
FIG.6A
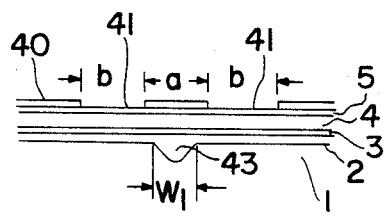
FIG.6B
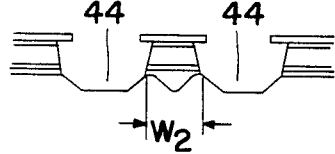
FIG.6C
FIG.6D
FIG.6E

SEMICONDUCTOR LASER DEVICE

BACKGROUND OF THE INVENTION

1. Field of the invention:

This invention relates to a semiconductor laser device and more particularly to an index guided semiconductor laser device which attains laser oscillation in a stabilized fundamental transverse mode at an extremely low threshold current level.

2. Description of the prior art:

In conventional semiconductor laser devices, buried-structure laser devices have the lowest threshold current, typical examples of which are buried-heterostructure (BH) laser devices (Japanese Patent Publication Nos. 52-40958, 52-41107, and 52-48066) and double channel planar buried-heterostructure (DC-PBH) laser devices (Japanese Patent Publication Nos. 62-2718 and 62-7719).

FIGS. 8 and 9 show a conventional BH laser device and a conventional DC-PBH laser device, respectively. These buried-structure laser devices oscillate a laser beam according to an index waveguiding operation and have an extremely low threshold current of 20 mA or less. However, if a proper refractive index is not applied to the burying layer 62 which is formed on both sides of the active layer 61, and if a proper width W corresponding to the width of the waveguide is not applied to the mesa, the device will oscillate in a high-order transverse mode. Thus, these buried-structure laser devices are not suitable for use when a laser beam spot is split into two or more. In order for the buried-structure laser devices to oscillate in a fundamental transverse mode, the width W of the mesa must be set in the range of 1 to 2 μm, which causes breakdown of the facets at a relatively low level of optical output power. Moreover, it is difficult to form a mesa with a narrow width, so that mass production of the device cannot be attained.

The index guided semiconductor laser devices also include V-channeled substrate inner stripe (VSIS) laser devices (Appl. Phys. Lett. vol. 40, 1982, p. 372). FIG. 10 shows a conventional VSIS laser device, which is produced as follows: On a p-GaAs substrate 1, a doped n-GaAs current blocking layer 71 (the carrier concentration thereof being $1 \times 10^{18}$ cm$^{-3}$ or more) is grown. Thereafter, a striped V-channel having the width Wc is formed in the substrate 1 through the current blocking layer 71, resulting in a current path. Then, on the current blocking layer 71 including the V-channel, a p-GaAlAs cladding layer 2, a GaAlAs active layer 3, an n-GaAlAs cladding layer 4, and an n-GaAs cap layer 5 are successively grown, resulting in a double-heterostructure multi-layered crystal for laser oscillation operation. Even when the width Wc of the waveguide is set at a value of as large as 4 to 7 μm, since a laser beam outside of the waveguide within the active layer 3 is absorbed by the current blocking layer 71 and the substrate 1, high-order mode gain is suppressed and a high-order transverse mode does not occur.

However, the threshold current of this VSIS laser device is 40 to 60 mA, which is extremely higher than that of the buried-structure laser devices. Moreover, the VSIS laser device has relatively large astigmatism of 5 to 10 μm. The reason why the threshold current becomes high is that current injected into the device is confined within the inner striped structure formed by the current blocking layer 71, but carrier injected into the active layer 3 diffuses in the transverse direction into the outside of the active layer 3, resulting in carrier unusable for laser oscillation. The unusable carrier results in unnecessary light based on the spontaneous emission and/or generates unnecessary heat, causing a decrease in reliability of the device. On the other hand, the reason why the VSIS laser device has large astigmatism is that light on both sides of the waveguide is absorbed by the current blocking layer 71 and the substrate 1, so that the wavefront of the light is retarded as compared with that of light in the central portion of the waveguide.

In order to solve the problems of both the buried-structure laser devices and the VSIS laser device, as shown in FIG. 11, a buried-VSIS (B-VSIS) laser device in which burying layers 6, 7, and 8 are formed on both sides of the V-channel of a VSIS laser device has been proposed by S. Yamamoto and T. Hijikata, J. Appl. Phys. 61, p. 3108 (1987). The B-VSIS laser device has excellent features of the VSIS laser devices that even when the width of the waveguide is set at a value as large as 4 to 7 μm, stable laser oscillation in a fundamental transverse mode can be attained. Moreover, in the B-VSIS laser device, the diffusion of carrier in the transverse direction within the active layer is prevented by the burying layer, resulting in a low threshold current of 20 mA and less.

However, in the conventional B-VSIS laser device shown in FIG. 11, the outside of the multi-layered crystal positioned over the V-channel is removed by an etching technique from the cap layer 5 to the current blocking layer 71, resulting in a striped mesa for laser oscillation operation. When the multi-layered crystal is grown by liquid phase epitaxy (LPE), a few defects with a diameter of several microns or more, which are referred to as pinholes, often appear on the top surface of the cap layer 5. The number of such defects is as many as there are a few defects within the surface area of a chip (the size thereof being usually 300×250 μm). As the outside of the multi-layered crystal disposed on the current blocking layer 71 including the V-channel is removed by an etching technique from the cap layer 5 to the said current blocking layer 71, both the size and depth of pinholes progressively increase, and when the n-GaAs current blocking layer 71 is to be etched, the pinholes pass through the said current blocking layer 71 and reach to the p-GaAs substrate 1. After the mesa-etching process, as shown in FIG. 11, burying layers 6, 7, and 8 are successively grown outside the mesa. The B-VSIS laser device produced in this way is disadvantageous in that the confinement of current cannot be attained at the portion in which pinholes are present, resulting in the occurrence of leakage current. Thus, there is a variation in the threshold current of laser devices formed on a wafer, which causes a decrease in reproducibility, reliability, and mass-producibility of the laser device.

Moreover, the B-VSIS laser device shown in FIG. 11 requires the following three epitaxial growth processes, which causes an increase in the number of manufacturing processes: the growth of the n-GaAs current blocking layer 71; the growth of the double-heterostructure multi-layered crystal comprising the layer elements 2 to 5 for laser oscillation which are formed on the current blocking layer; and the growth of the burying layers 6, 7, and 8. Moreover, the burying layer 7 is grown over the top surface of the cap layer 5, so that current injected into the device cannot flow to the mesa portion.

SUMMARY OF THE INVENTION

The semiconductor laser device of this invention, which overcomes the above-discussed and numerous other disadvantages and deficiencies of the prior art, comprises an optical waveguide that is formed within the active layer just above the striped channel of the substrate based on a decrease in the effective refractive index due to said striped channel, the outside of which absorbs a laser beam produced in the active layer; a striped mesa that is formed by the removal of the portions of said multi-layered crystal corresponding to the outside of said optical waveguide; and a plurality of burying layers that are grown into the removed portions to prevent the diffusion of carrier in the transverse direction within the active layer.

In a preferred embodiment, a high-resistive $Ga_{1-x}Al_xAs$ layer with an Al composition ratio x of 0.5 to 1 is used as said burying layer that comes into contact with the side walls of said striped mesa.

In a preferred embodiment, a plurality of $Ga_{1-y}Al_yAs$ layers with an Al composition ratio y of 0 to 1 are disposed as said burying layers on said high-resistive $Ga_{1-x}Al_xAs$ layer, said burying layers containing reverse biased p-n junctions therebetween.

In a preferred embodiment, the striped mesa contains, as the topmost layer thereof, an optical guiding layer having a diffraction grating that is formed in the top surface thereof in the direction perpendicular to said optical waveguide.

In a preferred embodiment, the removed portions are two striped grooves parallel to each other that are formed on both sides of said striped mesa.

Thus, the invention described herein makes possible the objectives of (1) providing a semiconductor laser device in which a burying layer that comes into contact with the side walls of the mesa is made of a high-resistive substance, resulting in a decrease in leakage current from the mesa to the burying layer, thereby attaining an extremely low threshold current level; (2) providing a semiconductor laser device in which a first burying layer is made of a high-resistive substance, so that even if a mesa-etching process has given rise to defects such as pinholes passing through the mesa to the substrate, these pinholes are filled with the high-resistive substance when the first burying layer is grown by liquid phase epitaxy, resulting in a definite threshold current of the laser devices formed on a wafer, thereby attaining a high production yield; and (3) providing a novel B-VSIS semiconductor laser device that does not require a current blocking layer, which is to be formed on the substrate in conventional buried-structure semiconductor laser devices, resulting in a decrease in the number of epitaxial growth processes, thereby attaining high productivity of the device.

BRIEF DESCRIPTION OF THE DRAWINGS

This invention may be better understood and its numerous objects and advantages will become apparent to those skilled in the art by reference to the accompanying drawings as follows:

FIGS. 5A and 5B are perspective views showing other examples of a semiconductor laser device of this invention.

FIGS. 6A to 6E are diagrams showing process of the production of the semiconductor laser devices of FIGS. 5A and 5B.

DESCRIPTION OF THE PREFERRED EMBODIMENTS

This invention provides a semiconductor laser device in which the area outside of the striped mesa is constituted by a plurality of burying layers containing reverse biased p-n junctions therebetween. In particular, a first burying layer that comes into contact with the side walls of the striped mesa is made of high-resistive substances. Therefore, the diffusion of carrier in the transverse direction within the active layer can be prevented.

In the production of the semiconductor laser device of this invention, after the mesa-etching process, a covering layer on the mesa portion is removed by an etching technique so that a cladding layer becomes the topmost layer of the mesa, and then the growth process of the burying layers mentioned above is carried out. At first, the area outside of the striped mesa is filled with a high-resistive burying layer. Then, p-type and n-type burying layers are successively grown on the high-resistive burying layer so as to form reverse biased p-n junctions therebetween. These burying layers cannot be grown over the surface of the cladding layer in the mesa portion, but can be grown on the area outside of the mesa portion.

However, the inventors of this invention have been found that a semiconductor layer can also be grown entirely over the surface of the cladding layer made of GaAlAs by liquid phase epitaxy, if the growth period thereof is set at a sufficiently large value. In this manner, a GaAs cap layer is grown even over the surface of the cladding layer of the mesa portion, and the surface of the cap layer becomes completely flat. The cap layer may also be formed by bringing the cladding layer into contact with a Ga solution and allowing to cool down at room temperature. The thickness of the cap layer is typically in the range of 30 to 40 $\mu$m.

Figure 7A:
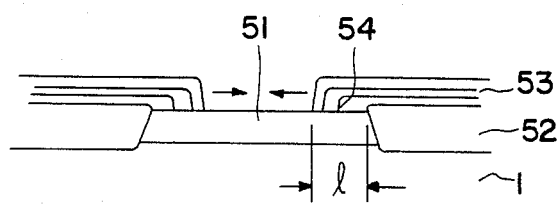
FIG. 7A is a diagram illustrating the growth of a $Ga_{1-x}Al_xAs$ layer on the top surface of a mesa by liquid phase epitaxy.

To study the growth of a semiconductor layer on the surface of the mesa by liquid phase epitaxy, primary experiments were carried out as follows: On a GaAs substrate 1, as shown in FIG. 7A, a $Ga_{1-x}Al_xAs$ layer (where $0 \leq X \leq 0.8$) with a thickness of about 1 $\mu$m was grown by liquid phase epitaxy. Then, the $Ga_{1-x}Al_xAs$ layer was subjected to a mesa-etching process, resulting in a striped mesa 51 with a width of about 10 $\mu$m. Thereafter, a $Ga_{0.5}Al_{0.5}As$ layer 52 was grown on the exposed portions of the GaAs substrate 1 so that the $Ga_{0.5}Al_{0.5}As$ layer 52 had approximately the same thickness as that of the mesa portion. Then, the subsequent growth of a GaAs layer 53 by liquid phase epitaxy was carried out for t hours. The growth temperature was 780° C. The rate of the cooling was 0.5° C./min. and the temperature of the supercooling was 4° C. The Al composition ratio x of the $Ga_{1-x}Al_xAs$ layer mentioned above was set at a value of 0.1, 0.2, 0.5, or 0.8 for each of four experiments.

Figure 7B:
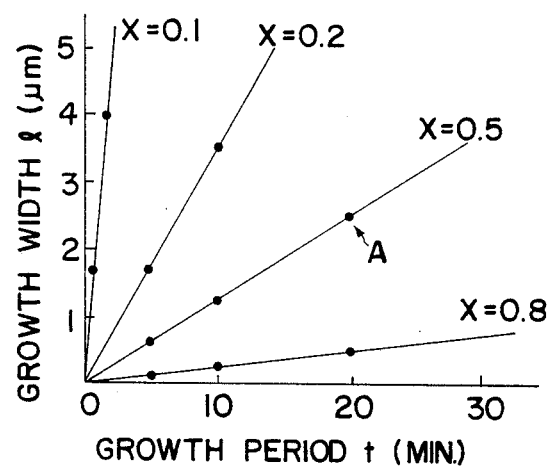
FIG. 7B is a graph showing the relationships between the growth period and the growth width obtained by the experiments of FIG. 7A.
Figure 8:
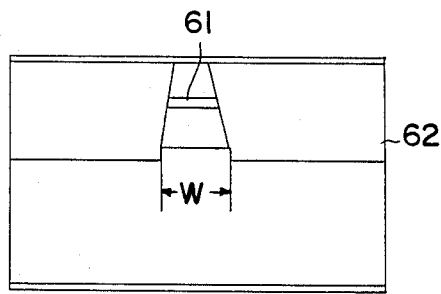
FIG. 8 is a cross-sectional view showing a conventional BH semiconductor laser device.
Figure 9:
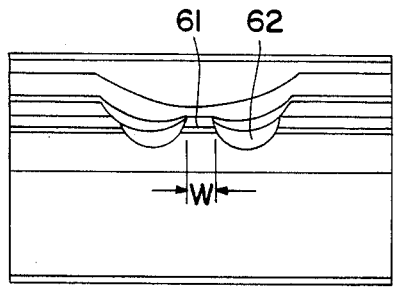
FIG. 9 is a cross-sectional view showing a conventional DC-PBH semiconductor laser device.
Figure 10:
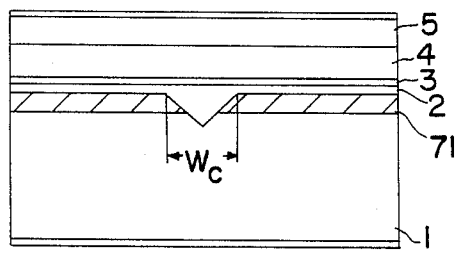
FIG. 10 is a cross-sectional view showing a conventional VSIS semiconductor laser device.
Figure 11:
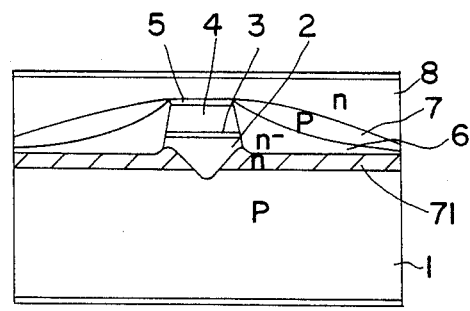
FIG. 11 is a cross-sectional view showing a conventional B-VSIS semiconductor laser device.

The relationships between the width l of the growth area of the GaAs layer 53 and the growth period t thereof were measured. The results are shown in FIG. 7B. As seen from this figure, the greater the Al composition ratio x of the $Ga_{1-x}Al_xAs$ layer at the surface of the mesa is, the longer the growth period to form the GaAs layer 53 entirely over the surface of the mesa becomes. It is also found that when the width of the mesa is about 5 μm, even if the Al composition ratio x is 0.5, the GaAs layer can be grown entirely over the surface of the mesa for a period of 20 minutes or more as shown the point A in the FIG. 7B, and the surface of the GaAs layer becomes flat.

According to the above-mentioned experimental results, this invention provides a novel semiconductor laser device that has the following features:

(1) The optical waveguide is not formed of the whole mesa portion surrounded by substances with a low refractive index, but formed of the striped rectangular channel or the striped V-channel contained in the mesa portion. Therefore, the optical waveguiding conditions in a transverse mode and the like are not determined by the refractive index of the burying layers or the width of the mesa, but determined by the amount of light absorbed by the outside of the striped channel of the substrate. Thus, the optical waveguide of the semiconductor laser device of this invention is formed within the active layer based on a decrease in the effective refractive index due to the striped channel of the substrate, the outside of which absorbs a laser beam produced in the active layer, whereas the optical waveguide of conventional BH semiconductor laser devices is formed within the active layer by the arrangement of burying layers on both sides of the mesa portion.

(2) The burying layer for the prevention of the diffusion of carrier in the transverse direction within the active layer is made of high-resistive substance (e.g., $Ga_{1-x}Al_xAs$ where $0.5 \leq X \leq 1$). The $Ga_{1-x}Al_xAs$ with a large Al composition ratio x has the property of being highly resistive, even when undoped or even when doped with Ge or Sn. This is because the energy level of impurities incorporated into the above-mentioned $Ga_{1-x}Al_xAs$ decreases, so that the concentration of carrier becomes small. On the other hand, it is difficult to form a high-resistive $Ga_{1-x}Al_xAs$ layer with an Al composition ratio x less than 0.5 by liquid phase epitaxy. Moreover, conventional buried-structure semiconductor laser devices have restrictions on the control of a transverse mode, so that a $Ga_{1-x}Al_xAs$ layer with an Al composition ratio x equal to or more than 0.5 cannot be used as a burying layer. By controlling the growth period, burying layers are not grown on the surface of the mesa, but only a GaAs cap layer can be grown thereon.

(3) After the covering layer formed on the mesa portion is removed by an etching technique so that a $Ga_{1-x}Al_xAs$ cladding layer becomes the topmost layer of the mesa portion, the growth process of the burying layers is carried out. By controlling the growth period, the growth of burying layers on the surface of the mesa can be completely restricted, but only a GaAs cap layer can be grown thereon.

(4) In one preferred embodiment, the burying layers for the prevention of the diffusion of carrier in the transverse direction within the active layer are grown into two striped grooves parallel to each other that are formed on both side of the mesa. The width of the striped grooves is typically in the range of 5 to 15 μm.

EXAMPLE 1

Figure 1:
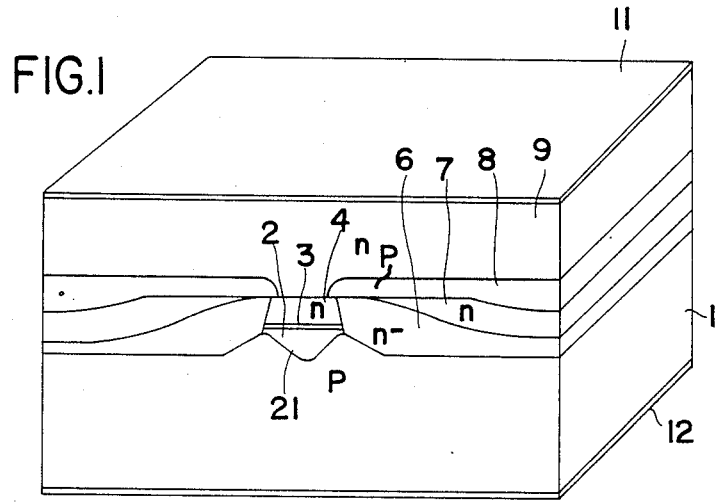
FIG. 1 is a perspective view showing a semiconductor laser device of this invention.
Figure 2A:
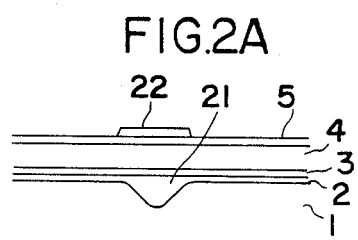
FIGS. 2A to 2D are diagrams showing processes of the production of the semiconductor laser device of FIG. 1.

FIG. 1 shows a buried-structure semiconductor laser device of this invention, which is produced as follows: On a p-GaAs substrate 1 in which a V-striped channel 21 has been formed, as shown in FIG. 2A, a P-$Ga_{0.55}Al_{0.45}As$ cladding layer 2, a p-$Ga_{0.85}Al_{0.15}As$ active layer 3, an n-$Ga_{0.55}Al_{0.45}As$ cladding layer 4, and an n-GaAs covering layer 5 are successively grown by liquid phase epitaxy. Then, a photoresist 22 (Az-1350) is applied to the surface of the covering layer 5, and a striped photoresist pattern with a width of 8 μm is formed just above the V-channel 21 by a photoetching technique.

Figure 2C:
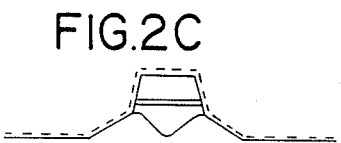
Figure 2D:
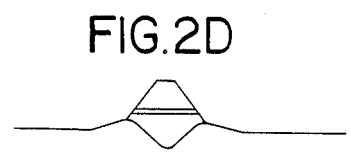
Figure 2B:
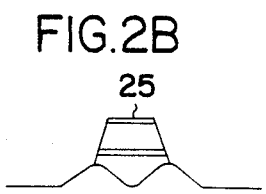

Next, as shown in FIG. 2B, the outside of the multilayered crystal positioned over the V-channel 21 is removed using an etchant ($H_2O:H_2O_2:H_2SO_4=50:2:1$) from the n-GaAs covering layer 5 to the surface of the p-GaAs substrate 1, resulting in a striped mesa 23 with a height of about 2 μm and a width of 4 to 6 μm at the top surface thereof. The width of the V-channel 21 is about 4 μm. Then, as shown in FIG. 2C, the covering layer 5 is removed using the same etchant as mentioned above.

The reason why the covering layer 5 is removed after the mesa-etching process will be explained herein below. If the striped photoresist pattern is formed directly on the cladding layer 4 without the covering layer 5 and then the mesa-etching process is conducted, since the etching rate of GaAlAs is greater than that of GaAs, the width of the mesa at the top surface thereof will become extremely small as shown in FIG. 2D, which causes a decrease in the reliability of the semiconductor laser device of FIG. 1. On the contrary, if the mesa-etching process is conducted with the covering layer 5 being formed on the cladding layer 4, the desired shape of the mesa will be obtained as shown in FIG. 2B. Thereafter, even if the entire surface is etched to remove the covering layer 5, the shape of the mesa will be maintained.

Then, an n⁻-$Ga_{0.2}Al_{0.8}As$ high-resistive first burying layer 6, an n-$Ga_{0.5}Al_{0.5}As$ second burying layer 7, a p-$Ga_{0.7}Al_{0.3}As$ third blocking layer 8, and an n-GaAs cap layer 9 were successively grown outside of the mesa by liquid phase epitaxy. The growth temperature was 780° C. According to the experimental data shown in FIG. 7B, the growth period of the third blocking layer 8 was limited to 10 minutes or less so that the third blocking layer 8 was not grown over the surface of the n-$Ga_{0.55}Al_{0.45}As$ cladding layer 4. The growth period of the n-GaAs cap layer 9 was 20 minutes or more so that the n-GaAs cap layer 9 was grown over the surface of the mesa, and the top surface of the n-GaAs cap layer 9 became flat. Then, the upper face of the n-GaAs cap layer 9 and the back face of the p-GaAs substrate 1 were subjected to a vapor deposition treatment with metal materials of Au-Ge-Ni and Au-Zn, respectively, and subjected to a heating treatment at 450° C. to form an n-sided electrode 11 of an alloy of Au-Ge-Ni and a p-sided electrode 12 of an alloy of Au-Zn, respectively. The wafer obtained was then cleaved to form a semiconductor laser device with a cavity length of 250 μm. The thickness of each of the burying layers 6, 7, and 8 at the thinnest portion thereof was 0.5, 1, and 0.5 μm, respectively. In this way, the pn⁻npn structure of the burying area functions to prevent completely the flow of current from the mesa to the burying area.

The resulting semiconductor laser device of this example oscillated a laser beam of a wavelength of 780 nm at a threshold current of 25 mA. This laser device can be produced in an extremely high yield even if a wafer with many pinholes on the surface of the covering layer 5 is used.

Moreover, another semiconductor laser device was produced in which the GaAs substrate was of an n-type and therefore the polarity of each of the layer elements was different from that of each of the layer elements shown in FIG. 1. In this case, the np⁻pnp structure of the burying area functions to prevent the flow of current from the mesa to the burying area. This semiconductor laser device also oscillated laser beam of a wavelength of 780 nm at a threshold current of 25 mA, and can be easily reproduced in an extremely high yield.

EXAMPLE 2

This example provides a distributed feedback (DFB) laser device shown in FIG. 3, which was produced as follows: On a p-GaAs substrate 1 in which a V-striped channel has been formed, a p-$Ga_{0.55}Al_{0.45}As$ cladding layer 2, a p-$Ga_{0.85}Al_{0.15}As$ active layer 3, an n-$Ga_{0.55}Al_{0.45}As$ carrier blocking layer 31, and an n-$Ga_{0.75}Al_{0.25}As$ optical guiding layer 32 were successively grown by liquid phase epitaxy. After a mesa is formed, a third-order diffraction grating 33 (the pitch thereof being 3435 Å) was formed in the top surface of the optical guiding layer 32 in the direction perpendicular to the V-channel by an interference exposure technique and a chemical etching technique. Then, an n⁻-$Ga_{0.2}Al_{0.8}As$ high-resistive first burying layer 6, an n-$Ga_{0.5}Al_{0.5}As$ second burying layer 7, a p-$Ga_{0.7}Al_{0.3}As$ third burying layer 8, an n-$Ga_{0.55}Al_{0.45}As$ cladding layer 4, and n-GaAs cap layer 9 were successively grown on both sides of the mesa by liquid phase epitaxy. The growth temperature was 800° C. According to the experimental data shown in FIG. 7B, the growth period of the burying layers 6, 7, and 8 was controlled to a certain value so that these burying layers were not grown over the surface of the optical guiding layer 32. The growth period of the n-cladding layer 4 and the n-cap layer 9 was so long that the n-cladding layer 4 and the n-cap layer 9 were entirely grown over the surface of the optical guiding layer 32. The top surface of the n-cap layer 9 became flat, on which the n-sided electrode 11 was formed. The p-sided electrode 12 was formed on the back face of the substrate 1.

Figure 4:
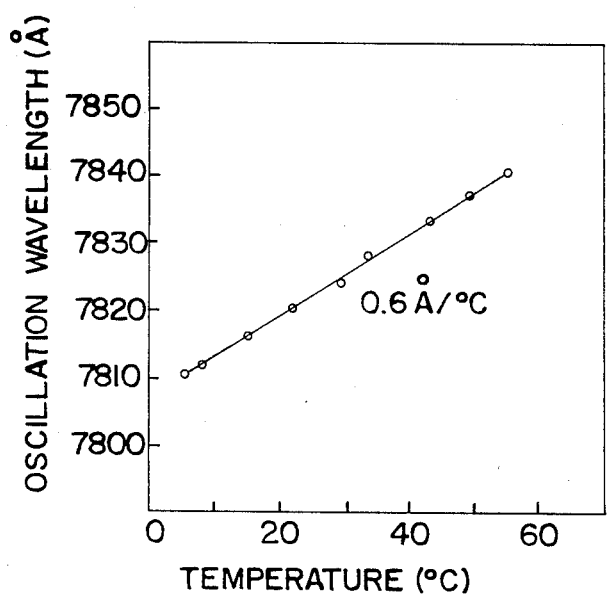
FIG. 4 is a graph showing the temperature dependence of the oscillation wavelength with respect to the semiconductor laser device of FIG. 3.

The resulting semiconductor laser device of this example oscillated a laser beam at a threshold current of 40 mA. FIG. 4 shows the temperature dependence of the oscillation wavelength with regard to the above-mentioned semiconductor laser device, indicating that DFB laser oscillation in a longitudinal mode was obtained without the occurrence of a high-order mode.

Figure 3:
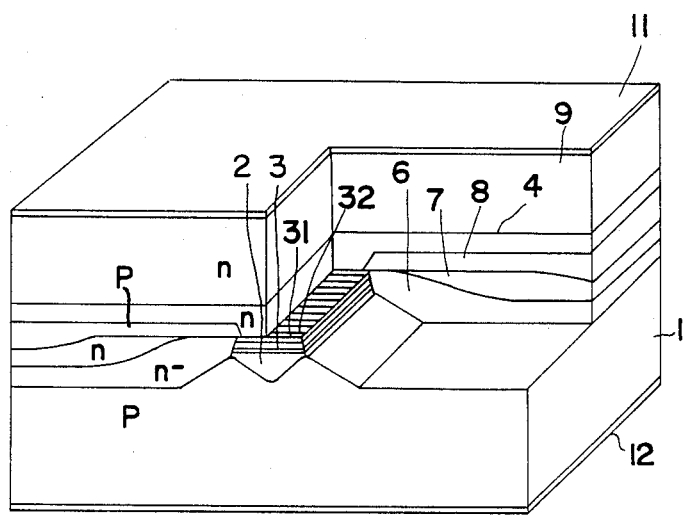
FIG. 3 is a perspective view showing another semiconductor laser device of this invention.

Moreover, another DFB laser device was produced in which an n-GaAs substrate was used and the polarity of each of the layer elements was different from that of each of the layer elements shown in FIG. 3. This laser device had the same excellent characteristics as those of the above-mentioned laser device of this example.

EXAMPLE 3

FIG. 5A shows another semiconductor laser device of this invention, which is produced as follows: As shown in FIG. 6A, on an n-GaAs substrate 1 in which a V-channel 43 with a width $W_1$ of 4 μm has been formed in the forward mesa direction (i.e., in the $<\bar{1}10>$ direction), an n-$Ga_{0.5}Al_{0.5}As$ cladding layer 2, a $Ga_{0.85}Al_{0.15}As$ active layer 3, a p-$Ga_{0.5}Al_{0.5}As$ cladding layer 4, and a p-GaAs covering layer 5 are successively grown by liquid phase epitaxy. Then, a photoresist 40 (Az-1350) is applied to the surface of the covering layer 5, and two striped windows 41 parallel to each other are formed on both sides of the central portion positioned over the V-channel 43. The width b of these windows was 7 μm, and the width a of the photoresist 40 remaining over the V-channel 43 was 10 μm. Then, grooves 44 were formed by an etching technique from the p-GaAs covering layer 5 to the n-GaAs substrate 1, resulting in a mesa with a width $W_2$ of 5.5 μm as shown in FIG. 6B. The etching treatment was conducted using an etchant ($H_2O:H_2O_2:H_2SO_4=50:2:1$). The depth and the width of the grooves 44 were 3.5 μm and about 12 μm, respectively. Then, only the photoresist remaining on the top surface of the mesa was exposed to light, and removed by development as shown in FIG. 6C. The wafer treated in this way was immersed in the same etchant as mentioned above to remove the p-GaAs covering layer 46 in the mesa area as shown in FIG. 6D. Finally, the remaining photoresist was removed using acetone.

Thereafter, as shown in FIG. 5A, a Ge-doped p⁻-$Ga_{0.15}Al_{0.85}As$ high-resistive first burying layer 6 and a Te-doped n⁺-$Ga_{0.4}Al_{0.6}As$ second burying layer 7 were successively grown at 780° C. by liquid phase epitaxy. The growth periods of the first and the second burying layers 6 and 7 were 4 minutes and 5 minutes, respectively. At this time, the striped grooves 44 were filled with the first burying layer 6 on which the second burying layer 7 with a thickness of about 1 μm was grown. The first and the second burying layers 6 and 7 were not grown over the surface 45 of the mesa even if the growth plane of the first or the second burying layer became higher than the surface 45 of the mesa.

Then, an Mg-doped p-GaAs cap layer 8 with a thickness of 10 to 30 μm was grown over the surface 45 of the mesa as well as the surface of the second burying layer 7. The top surface of the cap layer 8 became completely flat, on which the p-sided electrode 11 of Au-Zn is formed. The p-sided electrode 12 of Au-Ge is formed on the back face of the substrate 1.

FIG. 5B shows another semiconductor laser device of this example, which comprises an undoped or Sn-doped n⁻-$Ga_{0.15}Al_{0.85}As$ first burying layer 9, a Ge-doped p-$Ga_{0.7}Al_{0.3}As$ second burying layer 10, a Te-doped n⁺-$Ga_{0.4}Al_{0.6}As$ third burying layer 7, and an Mg-doped p-GaAs cap layer 8.

The above-mentioned B-VSIS laser devices were provided with resonant facets by a cleavage technique so as to have a cavity length of 250 μm, and measured for their device characteristics. The semiconductor laser devices of this example have an oscillation wavelength of around 780 nm and a threshold current of around 20 mA. These laser devices can be produced in an extremely high yield. Moreover, the difference between focal positions of a laser beam in the directions parallel to and perpendicular to the active layer, that is, the astigmatism of the semiconductor laser devices of this example was 5 μm or less, indicating that these laser devices have improved astigmatism as compared with conventional VSIS laser devices. Moreover, laser oscillation in an extremely stabilized transverse mode were attained in the same way as in the conventional VSIS laser devices.

Although this example discloses the semiconductor laser devices disposed on the n-GaAs substrate, it is also possible to produce semiconductor laser devices disposed on a p-GaAs substrate, in which the polarity of each of the layer elements is different from that of each of the layer elements shown in FIGS. 5A and 5B.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device with a stripe-channeled substrate and a double-heterostructure multi-layered crystal disposed over the substrate, said multi-layered crystal containing an active layer for laser oscillation, which semiconductor laser device comprises:

an optical waveguide that is formed within the active layer just above the striped channel of the substrate based on a decrease in the effective refractive index due to said striped channel, the outside of which absorbs a laser beam produced in the active layer;

a striped mesa that is formed by the removal of the portions of said multi-layered crystal corresponding to the outside of said optical waveguide; and a plurality of burying layers that are grown into the removed portions, said burying layers being made of high resistive substances to prevent the diffusion of carrier in the transverse direction within the active layer, and said burying layers being formed in a position other than above the upper face of said striped mesa.

2. A semiconductor laser device according to claim 1, wherein a high-resistive $Ga_{1-x}Al_xAs$ layer with an Al composition ratio x of 0.5 to 1 is used as said burying layer that comes into contact with the side walls of said striped mesa.

3. A semiconductor laser device according to claim 2, wherein a plurality of $Ga_{1-y}Al_yAs$ layers with an Al composition ratio y of 0 to 1 are disposed as said burying layers on said high-resistive $Ga_{1-x}Al_xAs$ layer, said burying layers containing reverse biased p-n junctions therebetween.

4. A semiconductor laser device according to claim 1, wherein said striped mesa contains, as the topmost layer thereof, an optical guiding layer having a diffraction grating that is formed in the top surface thereof in the direction perpendicular to said optical waveguide.

5. A semiconductor laser device according to claim 1, wherein said removed portions are two striped grooves parallel to each other that are formed on both sides of said striped mesa.

* * * * *